United States Patent [19]

Guddat et al.

[11] Patent Number: 5,031,141

[45] Date of Patent: Jul. 9, 1991

[54] APPARATUS FOR GENERATING SELF-TIMING FOR ON-CHIP CACHE

[75] Inventors: Douglas Guddat, Portland; Paul Madland, Beaverton, both of Oreg.

[73] Assignee: Intel Corporation, Santa Clara, Calif.

[21] Appl. No.: 505,776

[22] Filed: Apr. 6, 1990

[51] Int. Cl.⁵ ............................................. G11C 15/04
[52] U.S. Cl. ................................. 365/49; 365/189.07; 365/233
[58] Field of Search .................... 365/49, 233, 189.07, 365/233.5

[56] References Cited

U.S. PATENT DOCUMENTS

| | | | |
|---|---|---|---|
| 4,219,883 | 8/1980 | Kobayashi et al. | 365/49 |
| 4,628,489 | 12/1986 | Ong et al. | 365/233 |
| 4,794,567 | 12/1988 | Akatsuka | 365/233 |
| 4,833,642 | 5/1989 | OOi | 365/49 |
| 4,872,138 | 10/1989 | Ciacci | 365/49 |
| 4,926,384 | 5/1990 | Roy | 365/233.5 |
| 4,945,512 | 7/1990 | Pekarske et al. | 365/49 |
| 4,953,129 | 8/1990 | Kobayashi et al. | 365/233 |

Primary Examiner—Joseph E. Clawson, Jr.
Attorney, Agent, or Firm—Blakely, Sokoloff, Taylor & Zafman

[57] ABSTRACT

A circuit for generating timing signals for operating an on-chip cache memory in which read operations of the cache memory occur in a first phase of a clock cycle and while operations occur in a second phase of the clock cycle and in which the operations to be accomplished in the second phase require a time for performance which may exceed the length of the second phase comprising means for generating the beginning of a write select signal as soon after the occurrence of both a write pulse and a hit signal as possible, and means for terminating the write select signal after a delay initiated by second phase of the clock cycle and termianted after a time sufficient to allow a write to take plate which time may actually extend into the next phase of the clock cycle.

13 Claims, 7 Drawing Sheets

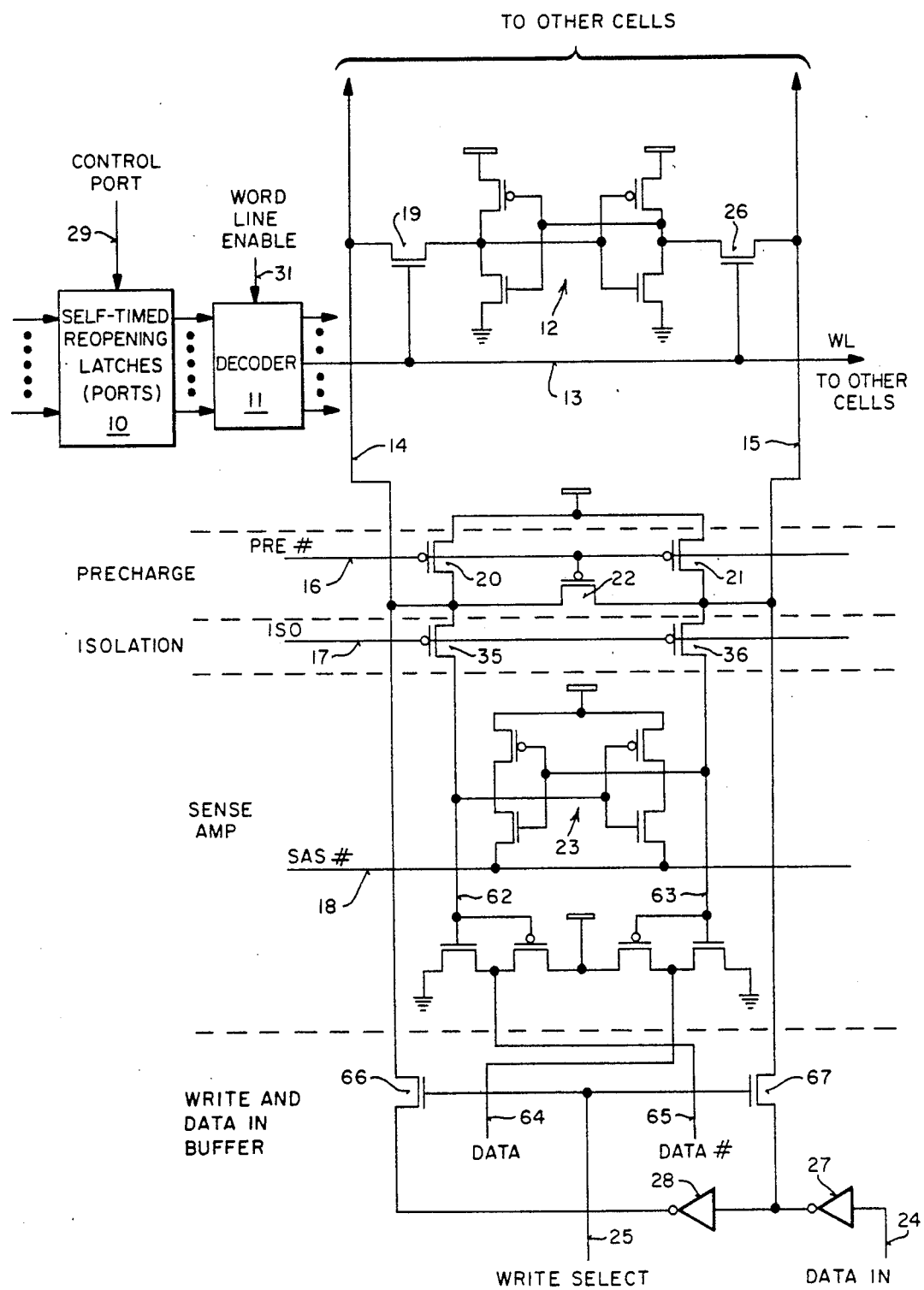
FIG_1

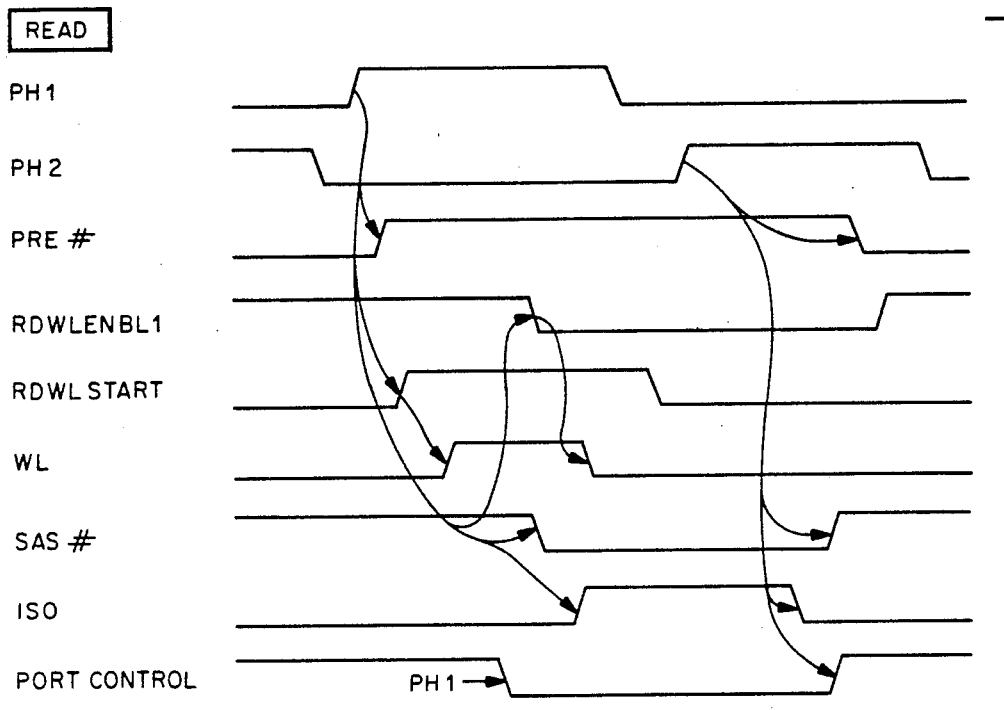
FIG_2A
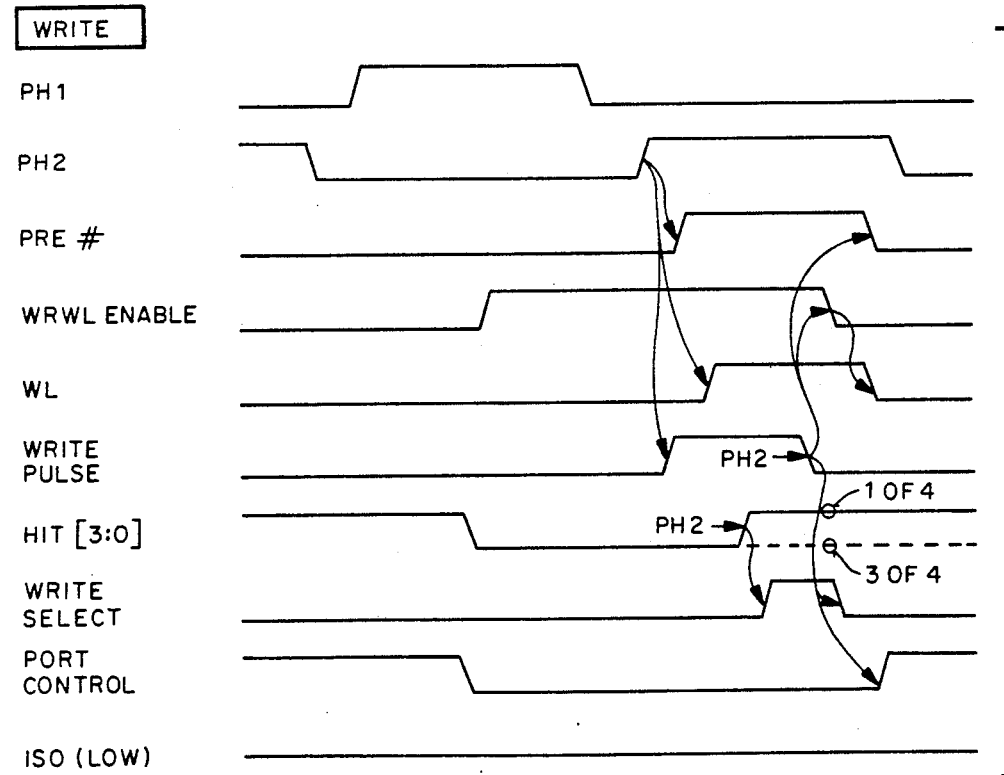
FIG_2B

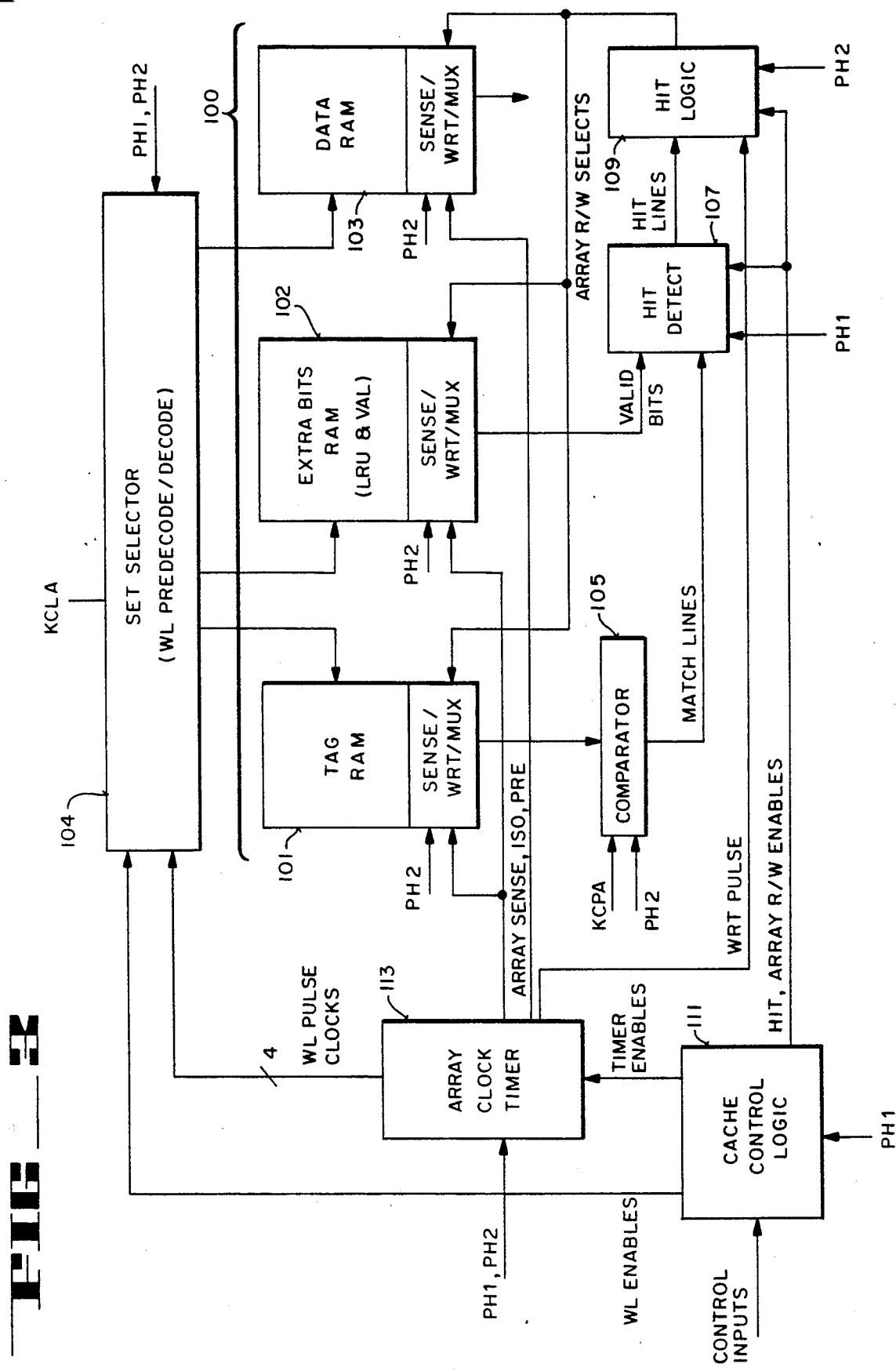
FIG_3

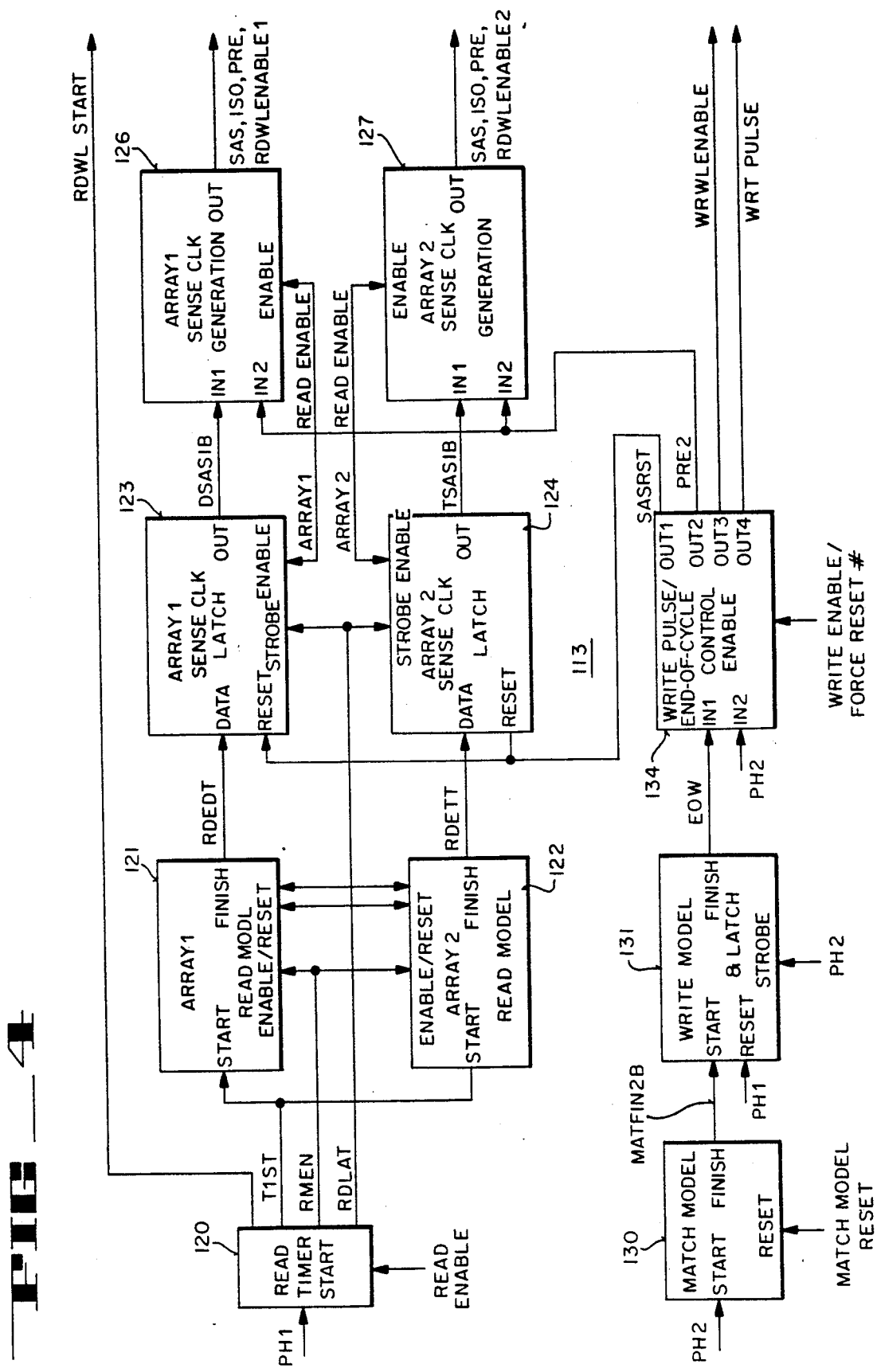
FIG_4

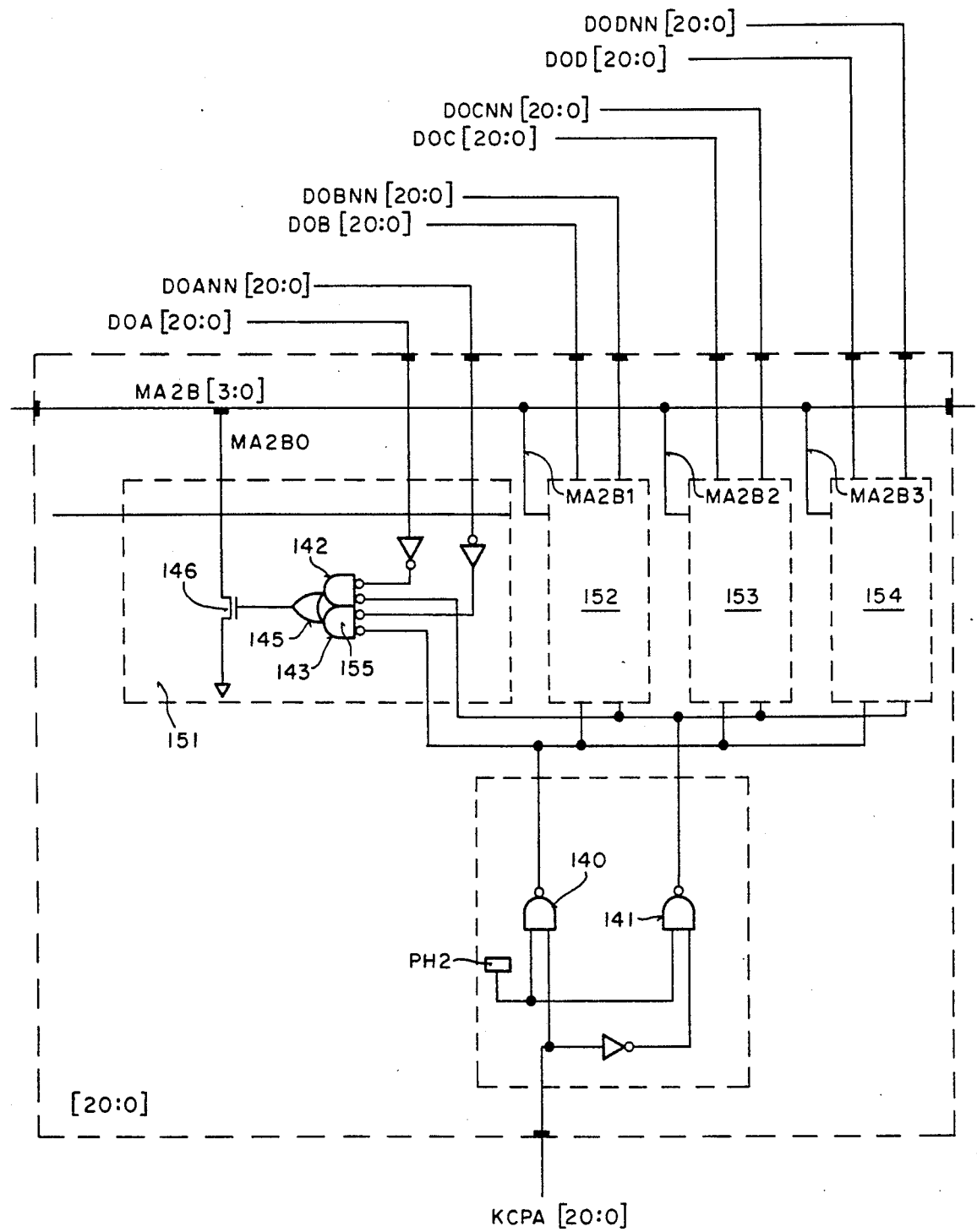
FIG_5

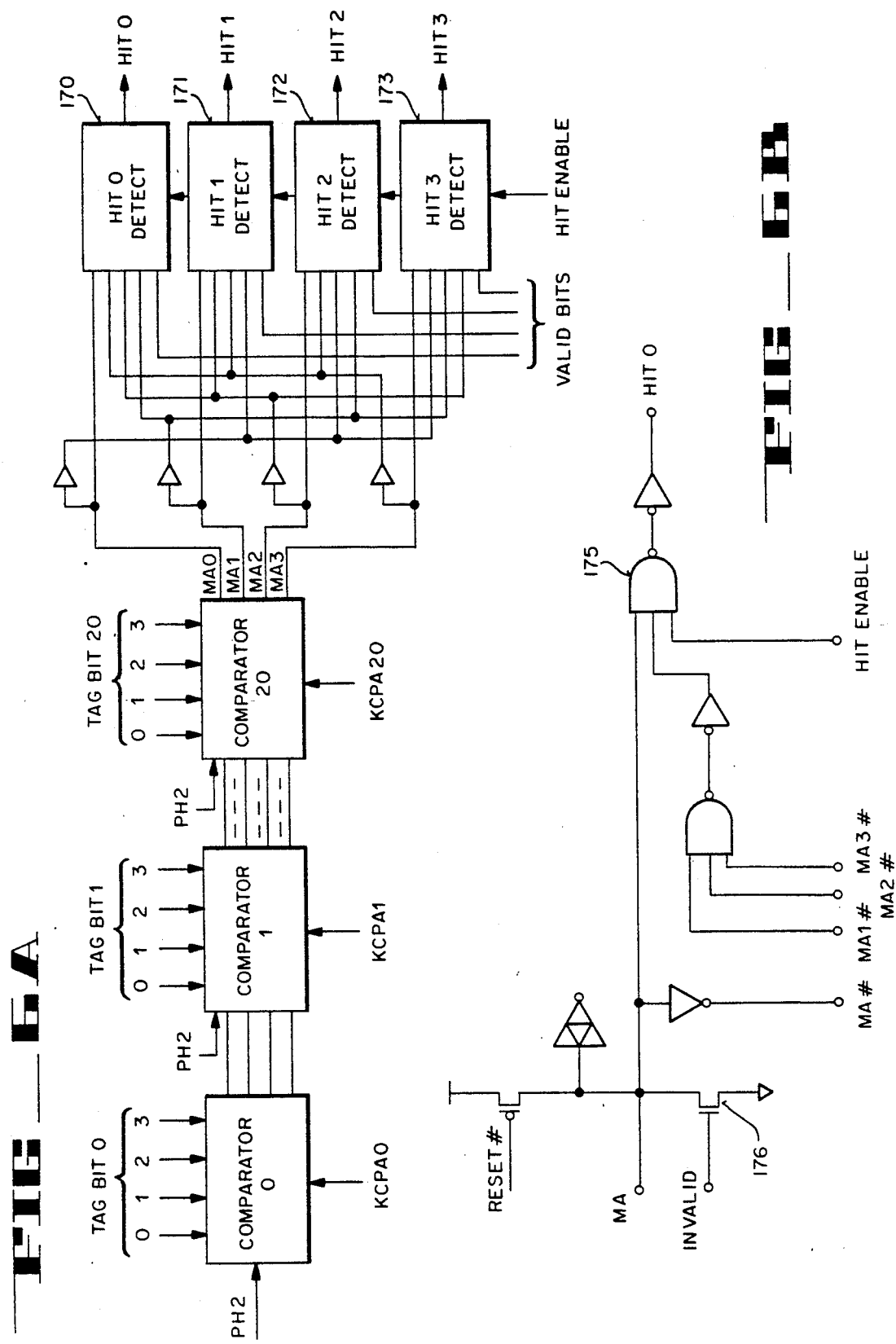

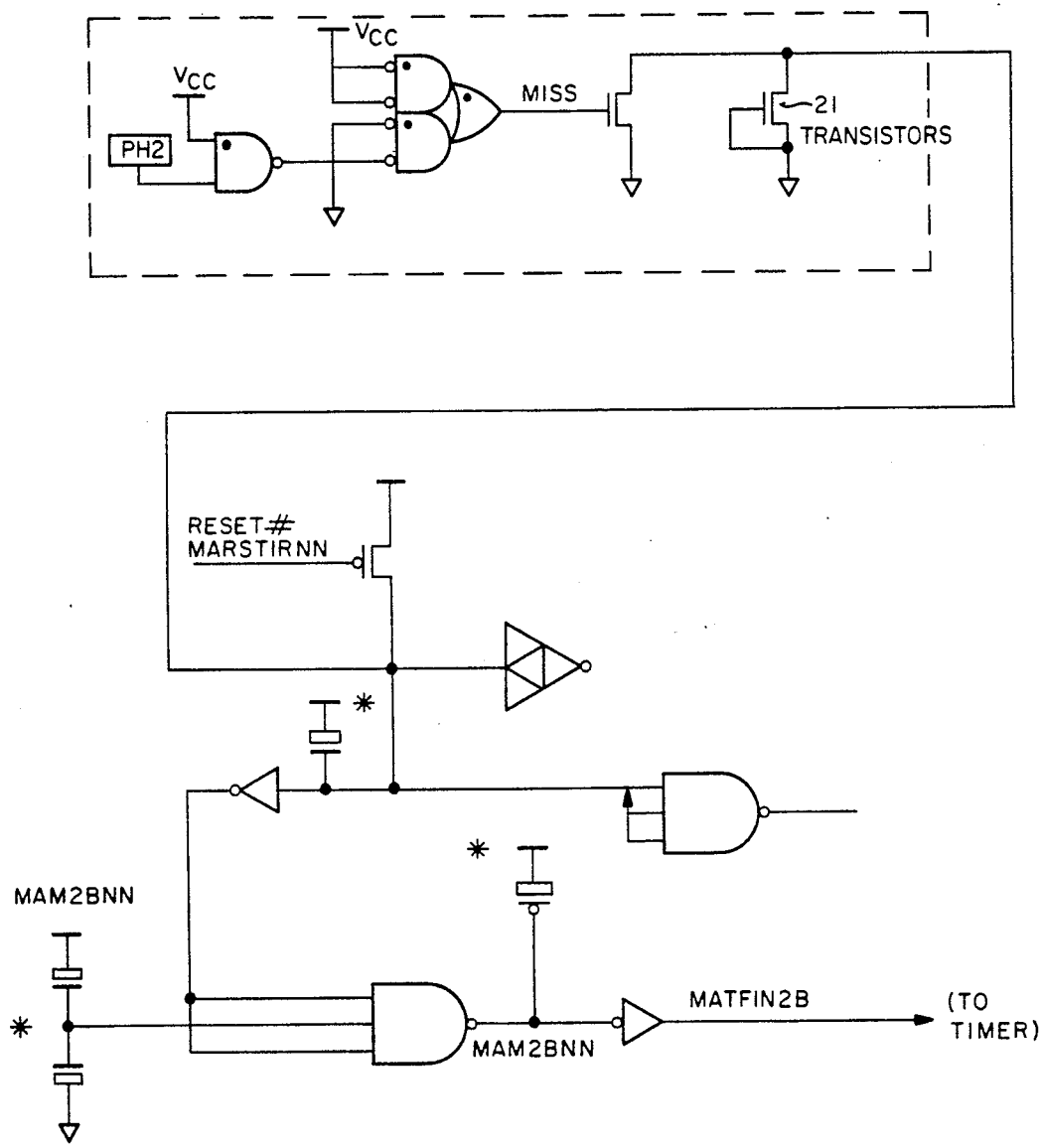
FIG_7

APPARATUS FOR GENERATING SELF-TIMING FOR ON-CHIP CACHE

BACKGROUND OF THE INVENTION

1. Field of the Invention

This invention relates to computer systems and, more particularly, to methods and apparatus for generating timing signals for operating a fast on-chip cache.

2. History of the Prior Art

In computer systems, the access of main memory to retrieve information often takes a substantial portion of the operational time. This occurs for various reasons. First, main memory is made of random access memory. Such memory is often sufficiently large that the cost is kept within bounds by using relatively slow memory. Second, main memory is typically accessed over a system bus which provides a less than optimum interface between the main memory and the central processing unit of the system.

For this reason, the use of cache memories to increase system speed has become prevalent in more advanced systems. A cache memory makes use of a relatively small amount of fast random access memory in which recently used instructions and data are stored as they are used by a processor. Such instructions and data are then available in the cache to be more rapidly accessed by the associated processor when next required. The basic theory of caching is that, in general, information which has been recently used is more likely to be used sooner than is other information. The cache memory is often both physically faster than the random access memory used for main memory and is arranged so that it may be addressed more rapidly than may main memory.

One way to increase the speed of cache memory for very fast computers is to place that cache memory on the same chip as the processor it serves. This eliminates delays caused by interfacing off-chip transfers and allows the circuitry to be optimized for use with the particular processor. However, in attempting to provide cache memory for very fast processors which are expected to process one instruction during each clock cycle of operation, the need for accurate timing of the signals controlling cache memory operation becomes dominant. In very fast caches, a limiting factor becomes the number of operations which must be accomplished within a clock cycle of operation. In some cases the time required to accomplish certain of these operations is longer than the time allotted by the system clock. While the problem may be solved by lengthening the clock period or by taking more than one clock period to accomplish certain cache operations, this is undesirable.

SUMMARY OF THE INVENTION

It is, therefore, an object of the present invention to provide circuitry for furnishing accurately timed signals for the operations of cache memory associated with very fast processors.

It is another object of the present invention to provide circuitry for furnishing timing pulses for on-chip cache memory capable of completing any cache memory operation within a single clock cycle of the processor.

It is another more specific object of the present invention to provide circuitry for furnishing timing pulses for on-chip cache memory which are self timed so that the operation of the cache memory may be made to some extent independent of external timing signals.

These and other objects of the present invention are realized in a circuit for generating timing signals for operating an on-chip cache memory in which read operations of the cache memory occur in a first phase of a clock cycle and write operations occur in a second phase of the clock cycle and in which the operations to be accomplished in the second phase require a time for performance which may exceed the length of the second phase comprising means for generating the beginning of a write select signal as soon after the occurrence of both a write pulse and a hit signal as possible, and means for terminating the write select signal after a delay initiated by the second phase of the clock cycle and terminated after a time sufficient to allow a write to take place which time may actually extend into the next phase one of the clock cycle.

These and other objects and features of the invention will be better understood by reference to the detailed description which follows taken together with the drawings in which like elements are referred to by like designations throughout the several views.

BRIEF DESCRIPTION OF THE DRAWINGS

FIG. 1 is a block diagram of a memory cell of a cache memory for which timing signals are provided by this invention.

FIG. 2 is a diagram illustrating the timing signals generated and utilized by the circuitry of this invention.

FIG. 3 illustrates in block diagram form the general arrangement of circuitry for operating the cache memory for which signals are provided by this invention.

FIG. 4 is a block diagram illustrating in more detail the array clock timer of this invention.

FIG. 5 is a circuit diagram illustrating the details of the comparator circuit used in this invention.

FIG. 6 is a circuit diagram illustrating the details of the hit detector circuit used in this invention.

FIG. 7 illustrates in detail the elements of the match model shown in block form in FIG. 4.

NOTATION AND NOMENCLATURE

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art.

An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to apparatus and to method steps for operating a computer in processing electrical or other (e.g. mechanical, chemical) physical signals to generate other desired physical signals.

DETAILED DESCRIPTION OF THE INVENTION

Referring now to FIG. 1, there is shown a circuit diagram of an individual memory cell which may be utilized in the cache memory of the invention. The present invention is realized with metal-oxide-semiconductor (MOS) technology, more specifically, with complementary MOS technology. Any one of a number of well-known CMOS processes may be used to realize the present invention. As currently implemented, the present invention is used as part of a cache memory where the memory cells in the cache memory are ordinary static cells which, however, are driven by signals in the manner of dynamic memory cells. It will be obvious that the present invention can be used in other memories. The entire memory with the timing circuit of the present invention is fabricated as an integrated circuit on the same substrate or die. This takes advantage of the fact that the process variations do not differ substantially over a single die. Hence, the characteristics of the devices in the timing circuit will be known relative to the characteristics of the devices in the memory array for a given die.

In FIG. 1, a single memory cell 12 is illustrated. The cell 12 comprises a pair of cross-coupled p-channel and n-channel transistors. The memory cell 12 is coupled to bit lines 14 and 15 through select transistors 19 and 26, respectively. The gates of the select transistors are coupled to a word line 13. The bit lines are coupled to other cells in the column; and the word line extends to other cells in the row.

The memory includes self-timed reopening latches 10 which receive address signals. These latches are controlled by a control port signal on line 29. The addresses are decoded by the decoder 11. This decoder receives a word line enable (control) signal (described later) on line 31 which controls the word line timing. The decoder 11 enables a single word line at a time, as is customary, allowing a row of cells to be coupled to their respective bits lines in the array. The address inputs to the decoder do not change during the time the word line enable 31 is active.

The bit lines 14 and 15 are precharged through the p-channel transistors 20 and 21 when the potential on line 16 is low. The transistor 22 equalizes the potential of the bit lines.

Transistors 35 and 36 isolate the bit lines from the sense amplifier 23. The signal ISO on the line 17 is used to control this isolation. The sense amplifier 23 is an ordinary strobed differential amplifier which is controlled by the sense amplifier signal SAS# on line 18. The output of this amplifier, lines 62 and 63, is coupled to a second stage of amplification to provide the output data and its complement on lines 64 and 65, respectively, when data is read from the cell.

When data is written into the cell 12, assuming the cell is selected by the word line 13, a write select control signal on line 25 causes the n-channel transistors 66 and 67 to conduct, coupling the data-in line 24 to the bit lines 14 and 15. Line 24 is coupled to bit line 15 through the inverter 27 and transistor 67; the output of the inverter 27 is coupled to another inverter 28 and then to the bit line 14 through the transistor 66.

The control signals required to read data from or write data into the cell 12 are generated by the timing circuit of the present invention and are shown in FIGS. 2(a) and 2(b). The control signals applied to the lines 16, 17, 18, 25, 29, and 31 of FIG. 1 are shown in FIGS. 2(a) and 2(b). In each of these illustrations a high signal indicates that the signal is asserted. A "#" sign indicates a NOT (or inverted) signal.

In the particular circuitry with which the invention is to operate, timing is based on phase 1 and phase 2 timing signals which are of equal frequency but opposite phase. These phase 1 and phase 2 clock signals are shown as PH1 and PH2 in each of FIGS. 2(a) and 2(b).

It is instructive to first describe the generation of the wordline enable signal 31. This wordline enable signal is the effective logical behavior of several actual signals used to control the wordline. The timing relationships of the signals used to generate the effective wordline enable signal 31 are shown in FIGS. 2(a) and 2(b). The behavior in phase 1 is generated as follows. The read wordline enable signal (RDWLENABLE) is asserted prior to phase 1 and allows the signal RDWLSTART initiated by the signal PH1 to trigger the start of the wordline signal WL. Sometime later and also initiated by the signal PH1, the read wordline enable signal (RDWLENABLE1) is deasserted thereby also deasserting the wordline signal WL. The behavior of the wordline enable signal 31 in pase 2 is generated as follows. The write wordline enable signal (WRWLENABLE) is asserted prior to the signal PH2 and allows the signal PH2 to trigger the start of the wordline signal WL. Sometime later but initiated as well by the signal PH2, the write wordline enable signal (WRWLENABLE) is deasserted thereby deasserting the signal WL.

In the read cycle illustrated in FIG. 2(a), as phase 1 is initiated by the PH1 signal going high, the precharge signal PRE# is asserted on the line 16 to turn off the precharge transistors 20 and 21 which were enabled in the previous phase 2 to precharge the bitlines 14 and 15 of the cell 12. Slightly thereafter and in response to the initiation of the signal PH1, the wordline enable signal is asserted at the terminal 31 to designate the particular word line being selected by the assertion of the wordline signal WL. At a time later in phase 1 determined by the timing arrangement of this invention, the sense amplifier strobe fires asserting the strobe signal SAS and deasserting the signal SAS# on the line 18 to pull down on the sense amplifier 23 and generate signal in the sense amplifier 23. After sensing is initiated, the isolation signal ISO on the line 17 is asserted causing transistors 35 and 36 to cease conducting. The data from the sense amplifier 23 is then ready for use in phase 2. After the sense amplifier is isolated, the signal WL is terminated by the deassertion of the wordline enable signal 31.

At some time after phase 1, the port control signal asserted on the line 29 to allow addressing of the cell 12 is removed so that the port is closed to new addresses until reopened. This allows an address to be trapped even during a period during which the wordline addresses are changing and provides a stable word line until the port is reopened. The wordline signal is ultimately terminated after a delay initiated by the beginning of the signal PH1. The reopening of the port is accomplished in phase 2 by asserting the port control signal at the terminal 29 through a self timing arrangement in accordance with the invention.

In phase 2 of the read cycle, the data provided must be stable for a period sufficient to set the output multiplexors of the cache memory circuitry and read the information in the data array. After the data has been read, an end of cycle signal arrives (coincident with the end of the write pulse as will be explained later), the signal ISO is deasserted, and the SAS# signal goes high on line 18 releasing the latch. At essentially the same time in response to the end of cycle signal, the signal PRE# goes low initiating precharge of the memory arrays, and the port control signal goes high reopening the control port 29 to new addresses.

During phase 1 of a write cycle illustrated in FIG. 2(b), on the other hand, the precharge signal PRE# is deasserted so that the precharge transistors 20 and 21 conduct to maintain precharge during phase 1. In this manner, bitline leakage occurring during phase 1 does not cause an inadvertent write during phase 2. The signal ISO is low throughout the write cycle. The write operations which occur in phase 2 depend upon the occurrence of signals which are generated in phase 1. For example, a read of the directory addresses stored in the cache memory array (which are to be compared with a desired address to produce a hit) must occur in phase 1 before information can be written to an address in the cache memory.

In phase 2 of the write cycle, the signal PRE# is asserted in response to the PH2 signal to turn off the precharge of the bitlines 14 and 15, and the wordline enable signal is asserted to select the desired wordline for writing. The write pulse from the array clock timer (FIG. 3) is also asserted in response to the PH2 signal. A short time later, one of four hit signals HIT[3-0] signifies a hit in the cache memory. The ANDing of the hit and write pulse signals generates a write select signal.

The write pulse is terminated in response to a self-timing arrangement to be discussed later. When the write pulse terminates at the end of the write cycle, this causes the write select pulse to turn off, the word line to turn off, the port control signal to be asserted, and the precharger to turn on thereby terminating the cycle. It should be noted that the use of the self timing arrangement described in this specification allows the various signals necessary to the write operation to be delayed so that they actually continue in some cases into the next phase 1 of the system operation. Moreover, the arrangement also allows precharging to extend from phase 2 into phase 1, allowing the bits lines to be precharged as long as possible. Thus, the effect of the self timing is to relieve some of the stringency of the system timing by replacing it with slightly delayed internal cache self timing. Without this feature, the system would not be able to produce one cache operation for each system clock cycle.

FIG. 3 illustrates in block diagram form the general arrangement of circuitry for operating the cache memory for which signals are provided by this invention. The arrangement includes the cache memory array 100 which in the preferred embodiment is a four way set associative cache, a cache memory which contains four possible locations for each line from main memory. The preferred embodiment of this on-chip cache memory is a 64K bit data array organized as 128 data bits by 128 word lines by four elements.

The cache memory array 100 is divided into a tag array 101 organized as 21 bits by 128 word lines by four elements, an extra bit array 102 organized as seven bits (four valid and three for an algorithm for discarding data) by 128 word lines, and a data array 103 organized as 128 bits by 128 word lines by four elements. The tag array 101 contains the main memory physical address locations (the so-called tags) corresponding to data in the data array 103. The extra bit array 102 contains valid bits indicating whether the information in the cache is valid or has become stale for some reason; this array 102 also includes data for a "pseudo-least recently used" algorithm for selecting data to be replaced in the cache when updating the cache tag and data arrays with a new line from main memory. The tag array and the extra bits array are together sometimes referred to as a cache directory. It should be noted that the separation of the tag array 101 and the extra bits array 102 in the present invention allows the tag array to be operated more simply than would be possible were the two arrays combined because the read/modify/write sequence typical of an operation in the extra bits array need not be followed in accessing the tag array. The data array 103 contains the actual data which is to be furnished to the central processing unit associated with the cache memory.

The circuitry also includes a set selector circuit 104 which uses the low order bits of the address being accessed to determine the particular word line for the information being accessed. This circuit is constructed in a manner well known to the prior art and its details are therefore not included herein. A comparator circuit 105 compares the addresses stored in the tag array 101 for a word line with the address being accessed to determine whether the information resides in the cache memory. A hit detector circuit 107 receives the results of any match determined by the comparator and the valid bits pertaining to the data at the address and signals a hit when the two coincide and when one and only one match line remains high. A hit logic circuit 109 receives an indication of a hit and provides read/write select signals to the arrays 101-103 of the cache array 100. A cache control circuit 111 provides enable signals to the different portions of the cache circuitry, and an array clock timer 113 generates the various timing signals for operating the cache memory in accordance with this invention.

The operation of the circuit illustrated in FIG. 3 proceeds as follows, an input address KCLA is furnished to the set selector circuit 104. The seven bits of this address are used for set selection of the four possible lines at which the information might be stored in the cache memory. The set selector circuit decodes the seven bits and provides input to enable the appropriate word line for each of the arrays 101-103. Meanwhile, the upper twenty-one bits of virtual address information are translated to physical addresses by a translation look aside buffer (not a part of this description) and transferred to the comparator 105. The addresses at the chosen word line of the tag array 101 are compared by the comparator 105 with the physical address KCPA provided to generate signals on four match lines based on whether there is an address match. The hit detector circuit 107 generates positive hit signals if there is a valid match indicated by the comparator circuit 105. These hit signals are used to generate read and write pulses for all three arrays 101-103. Details of the comparator circuit 105 are illustrated in the circuit diagram of FIG. 5.

The match from the comparator circuit 105 is combined with the valid bits for that address stored in the extra bits array 102 by the hit detector circuit 107. If the information is valid, the hit detector 107 notifies the hit logic circuit 109. The hit logic circuit 109 provides signals under control of cache control logic 111 and the array clock timer circuit 113 for timing the reading and writing of the cache memory.

The timing signals are, in general, developed by the array clock timer. FIG. 4 is a block diagram illustrating the array clock timer 113 in more detail. The circuit 113 includes a read timer start circuit 120. All read operations in the cache 100 take place in phase 1 so the read timer start circuit 120 begins when it receives input from the phase 1 clock PH1. The read timer start circuit 120 provides a start signal to a pair of read models 121 and 122 which are circuits which model the operation of an actual read operation by providing an output signal after a delay equal to the worst case delay through the actual circuits. One read model 121 is provided to emulate the delay of the data array 103, and one read model 122 is provided to emulate the delay of the tag and extra bit arrays 101 and 102.

The outputs of the read models 121 and 122 are furnished to a pair of latches 123 and 124 which function to retain the signal into phase 2 of the clock cycle. These circuits are constructed in a manner well known to the prior art and their details are therefore not included herein. The read model circuits are reset by signals from the read timer start circuit 120 during phase 2 of the clock cycle. From the latches 123 and 124, the signals are transferred to circuits 126 and 127 which generate the sense amplifier clock, the precharge, and the isolation timing signals SAS#, PRE#, and ISO. Circuits for generating pulses in response to timed input signals are well known to the prior art and their details are therefore not included herein. It should be noted that the timing signals are provided from each of the two sense clock generation circuits 126 and 127. Since the read models 121 and 122 are adapted to reproduce the timing to emulate the delay of the data array 103 and the delay of the tag and extra bit arrays 101 and 102 separately, these timing signals are adapted to very precisely operate the cells of the different portions of the array.

All writes take place in phase 2, and the write and reset portion of the circuit 113 is triggered by the phase 2 clock PH2. This signal is furnished both to a match model circuit 130 which models the delay in the comparison circuit 105 and the hit detector circuit 107 and to a write model and latch circuit 131. After an appropriate delay which matches the time required to accomplish the match in the comparison circuit 105 and the hit detector circuit 107, the match model 130 furnishes a signal to the write model 131 which also receives the clock signal PH2. The write model provides a delay which is matched to the delay of a cell write operation. The output of the write model 131 occurs only after the delay through the match model 130 and the write model 131 and indicates the end of the write pulse. This signal is transferred to a write pulse/end of cycle control circuit 134. The write model circuit and latch circuit is reset by the phase 1 clock signal PH1.

The circuit 134 also receives the PH2 signal as input and initiates the write pulse in response to that signal. The circuit 134 terminates the write pulse upon the receipt of the signal from the output of the write model 131 after the delay through the match model 130 and the write model 131. It should be noted that this same timing is used for the termination signal for the read cycle. This is done by using the end of cycle signal to initiate the precharge of the bit lines. This is done in the case of a read cycle by an early reset signal sent to the sense clock latches 123 and 124 to reset those latches and initiate the operation of the sense clock generation circuits 126 and 127 which initiates the precharge signal. The write cycle termination takes a second path through the late reset signal sent to the sense clock generation circuits 126 and 127 to initiate a precharge signal. Thus, the circuit 134 initiates the write pulse signal, provides reset signals to the latches 123 and 124 to clear them after a read, provides reset signals to circuits 126 and 127 to initiate precharge and reopen the port control and to terminate sensing and isolation, and terminates the write pulse.

FIG. 5 is a circuit diagram illustrating the details of the comparator circuit 105 used in this invention. The circuit 105 illustrated is repeated twenty-one times, once for each of the bits of the tag address stored in the tag array 101. The circuit 105 includes four distinct comparators 151-154 each representing one of the possible four bit positions in which the information might be stored; only the comparator 151 is illustrated in detail. The physical address represented by the signal KCPA from the translation look aside buffer is compared to each of the stored tag addresses at a complex gate 155. The match lines MA2B are precharged high and will discharge if the physical address and the tag do not match. The lack of a match indicates that the information is not stored at that bit position of the cache memory.

The actual operation of the comparator is as follows. Each bit from the physical address KCPA and its inverted state is transferred to one of the twenty-one individual comparators 105 through a pair of gates 140 and 141. These signals are individually applied to one of two NOT AND gates 142 and 143 of the complex gate 155. Applied to the other terminals of the gates 142 and 143 are the bits stored in the tag array 101. In order to assure that the sense amplifier has received the signal SAS#, the data signal and the inverted data signal must both be provided. These are the data appearing at the data terminal 64 and its inverse appearing at the terminal 65 of the cell illustrated in FIG. 1. The bits are compared and if either set is the same, no signal is transferred from that gate 142 or 143; consequently, if both sets are the same, a match has occurred and no output is produced by either gate 142 or 143. The outputs of the gates 142 and 143 are transferred by an OR gate 145 to turn on a transistor 146 if either set does not match. The turn on of the transistor 146 grounds the match line MA and thus signifies that no match has occurred on the particular line.

The results of the match operation in the comparator are directed to the hit detector circuit 107 (see FIGS. 6(a) and 6(b)). FIG. 6(a) illustrates in block form the twenty-one different comparators of the comparator circuit 105 with their inputs described above. The four output match lines MA0-MA3 from each comparator are sent to an arrangement which provides a hit detection signal if one and only one of the lines indicates a match has taken place and indicates the line on which the match occurs. Thus, the signal on line MA0 is transferred directly to hit0 direct circuit 170 along with the inverted signals on the lines MA1, MA2, and MA3. In like manner, the signal on the line MA1 is sent to the hit1 detect circuit 171 with the inverted signals from the other match lines, the signal on the line MA2 is sent to the hit2 detect circuit 172 with the inverted signals from the other match lines, and the signal on the line MA3 is sent to the hit3 detect circuit 173 with the inverted signals from the other match lines. The hit[0-3] detect circuits 170-173 also receive from the extra bits array 102 an indication whether the information at the address at the word line is valid or not. If valid and if one and only one of the match lines indicates a match has taken place, an output hit signal is produced which indicates the line on which the match occurred.

The specific circuitry for the preferred embodiment of a hit detect circuit 170-173 is illustrated in FIG. 6(b). The match signal being tested is transferred as one of the inputs to an AND gate 175. This signal is grounded if the interrogation of the extra bit array signifies that the address is invalid by turning on a transistor 176. A second input to the gate 175 is provided by the ANDing of the inverted signals on the other three match lines. A third input to the gate 175 is an enable signal. The use of the circuit illustrated in FIG. 6(b) allows the generation of a true edge for the hit signal which allows the hit to be used as a timing signal.

A signal indicating a hit detection is transferred from the hit detector circuit 107 to the hit logic circuit 109 on the hit lines. The hit logic circuit 109 ANDs the hit signal with the write pulse from the array clock timer 113 to produce a write select pulse which is directed to the sense/write/mux portion of the array 100. It will be recalled that the array clock timer 113 initiates a write pulse in response to the initiation of phase 2. This pulse is furnished to the hit logic circuit 109. When a hit is indicated by the results produced from the comparator 105 and the hit detector 107, a hit signal (one of the signals HIT[3:0]) actually times the beginning of the write select. That is, the hit logic circuit 109 has received the write pulse at an AND gate and is merely waiting for the hit detection signal to furnish the write select output signal. This use of the hit signal to precisely time the application of the write select signal provides the fastest possible operation of the cache memory.

As pointed out above, the end of the write pulse occurs in response to the timing provided through the match model 130 and the write model and latch 131 of the array clock timer 113. Consequently, when the write pulse is terminated after the delay afforded by these models, the write pulse input to the AND gate of the hit logic circuit 109 is removed terminating the write select pulse.

This same delay is utilized to reset the latches 123 and 124 of the circuit 113 and the circuits 126 and 127 of the circuit 113. The reset of the circuits 126 and 127 terminates the read timing signals SAS, ISO, and PRE# thereby determining the end of the read cycle phase 2.

In the case of the models used in the present invention, the circuitry thereof provides all of the essential delays of the actual circuitry on which the circuits are modelled. This is accomplished in a manner well known to the prior art by providing circuitry which includes the capacitances and resistances of the actual circuits and any switches which must be operated, all selected to provide the worst case delay for such circuit. The only real modification necessary to the actual circuitry used upon which the models are designed is to make sure that the model always provides an output signal which may be used for the timing delay even though the circuit upon which it is modelled may not always provide an output. For example, the read model includes those portions of the actual memory cell, of the bit lines, and of the word line used by the actual circuitry in the read operation. The write model and latch includes those portions of the actual memory cell (including the switches), of the bit lines, of the word line, and the write devices for providing signals to the circuitry used by the actual circuitry in the write operation. The match model and hit detector includes circuitry modeling the arrangements illustrated in the comparator and the hit detector illustrated herein.

FIG. 7 illustrates in detail the elements of the match model 130 shown in block form in FIG. 4. It will be noted that the elements of the compare circuit 105 (the complex gate arrangement 155 and the gates which provide input thereto along with the output transistor which indicates a miss has occurred) are repeated in the circuit of FIG. 7 so that the delay therethrough models the delay through the comparator circuit 105. The details of the hit detector model are essentially identical to the hit detector circuit 107.

U.S. patent application Ser. No. 07/290,257, entitled MEMORY TIMING CIRCUIT EMPLOYING MODELS, P. D. Madland, filed Dec. 27, 1988 and assigned to the assignee of this invention describes the use of models in constructing circuitry for generating timing signals for operating a memory array. Moreover, details of read model circuits and write model circuits are illustrated in that patent application. Circuitry in accordance with the teaching of that patent application may be utilized in providing models for the present invention. Basically what is required for each of these model circuits is that the elements which appear in the actual circuitry and are used in accomplishing a read or a write are reproduced in the model in order that the same (worst case) delays be produced through the model as would be produced through the actual operating circuitry. Thus, for a read model, the word line delay, and those portion of the cell and the bit lines used in a read are reproduced. For a write model, the word line delay, and those portion of the cell and the bit lines used in a write are reproduced.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A circuit for generating timing signals for operating an on-chip cache memory in which read operations of the cache memory occur in a first phase of a clock cycle and write operations occur in a second phase of the clock cycle comprising means for generating a write pulse, means for generating a signal to indicate a hit has occurred in the cache memory, means for comparing the coincidence of the write pulse and the signal indicating a hit to initiate a write select signal, means for providing a delay indicating the length of a write select signal, and means for terminating the write select signal after such delay.

2. A circuit for generating timing signals for operating an on-chip cache memory as claimed in claim 1 in which the means for generating a signal to indicate a hit has occurred in the cache memory comprises means for interrogating a tag portion of the cache memory apart from other portions of the cache memory whereby the interrogation of the tag portion may be accomplished in a single phase of the clock cycle.

3. A circuit for generating timing signals for operating an on-chip cache memory in which read operations of the cache memory occur in a first phase of a clock cycle and write operations occur in a second phase of the clock cycle and in which the operations to be accomplished in the second phase require a time for performance which may exceed the length of the second phase comprising means for generating the beginning of a write select signal as soon after the occurrence of both a write pulse and a hit signal as possible, and means for terminating the write select signal after a delay initiated by second phase of the clock cycle and terminated after a time sufficient to allow a write to take place which time may actually extend into the next phase one of the clock cycle whereby the timing signals operating the cache memory are separated from the timing signals used for the system.

4. A circuit for generating timing signals for operating an on-chip cache memory as claimed in claim 3 in which the means for generating the beginning of a write select signal as soon after the occurrence of both a write pulse and a hit signal as possible comprises means for generating a signal indicating a hit has occurred, and means responsive to the simultaneous application of a hit signal and a write pulse for generating a sense pulse.

5. A circuit for generating timing signals for operating an on-chip cache memory as claimed in claim 3 in which the means for terminating the write select signal after a delay initiated by second phase of the clock cycle and terminated after a time sufficient to allow a write to take place which time may actually extend into the next phase one of the clock cycle comprises means for generating a delay modelled on the time required to determine that a hit has occurred and the time required to write to a memory cell.

6. A circuit for generating timing signals for operating an on-chip cache memory as claimed in claim 4 in which the means for terminating the write select signal after a delay initiated by second phase of the clock cycle and terminated after a time sufficient to allow a write to take place which time may actually extend into the next phase one of the clock cycle comprises means for generating a delay modelled on the time required to determine that a hit has occurred and the time required to write to a memory cell.

7. A circuit for generating timing signals for operating an on-chip cache memory as claimed in claim 6 further comprising means responsive to the means for terminating the write select signal after a delay initiated by second phase of the clock cycle and terminated after a time sufficient to allow a write to take place for terminating a read operation.

8. A circuit for generating timing signals for operating an on-chip cache memory in which read operations of the cache memory occur in a first phase of a clock cycle and write operations occur in a second phase of the clock cycle and in which the operations to be accomplished in the two phases require a time for performance which may exceed the length of the phases when measured from the beginning of each phase comprising means for initiating a read operation a predetermined time after the beginning of a first phase of a clock cycle, means for initiating a write select signal as soon after the occurrence of both a write pulse and a hit signal as possible, and means for terminating the write select signal after a delay initiated by the second phase of the clock cycle and terminated after a time sufficient to allow a write to take place which time may actually extend into the next phase one of the clock cycle whereby the timing signals operating the cache memory are separated from the timing signals used for the system.

9. A circuit for generating timing signals for operating an on-chip cache memory as claimed in claim 8 further comprising means responsive to the means for terminating the write select signal after a delay initiated by second phase of the clock cycle and terminated after a time sufficient to allow a write to take place for terminating a read operation.

10. A circuit for generating timing signals for operating an on-chip cache memory as claimed in claim 8 in which the means for generating the beginning of a write select signal as soon after the occurrence of both a write pulse and a hit signal as possible comprises means for generating a signal indicating a hit has occurred, and means responsive to the simultaneous application of a hit signal and a write pulse for generating a sense pulse.

11. A circuit for generating timing signals for operating an on-chip cache memory as claimed in claim 8 in which the means for terminating the write select signal after a delay initiated by second phase of the clock cycle and terminated after a time sufficient to allow a write to take place which time may actually extend into the next phase one of the clock cycle comprises means for generating a delay modelled on the time required to determine that a hit has occurred and the time required to write to a memory cell.

12. A circuit for generating timing signals for operating an on-chip cache memory as claimed in claim 10 in which the means for generating a signal indicating a hit has occurred comprises means for generating a signal having a true edge which may be used as a timing signal.

13. A circuit for generating timing signals for operating an on-chip cache memory as claimed in claim 10 in which the means for generating a signal indicating a hit has occurred comprises a plurality of means for comparing an address with a stored address, and means for generating a signal when one and only one of the means for comparing an address with a stored address produces a true signal.

* * * * *